(12) United States Patent
Sato

(10) Patent No.: US 9,134,605 B2
(45) Date of Patent: Sep. 15, 2015

(54) PATTERN FORMATION METHOD

(75) Inventor: Hironobu Sato, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 13/590,583

(22) Filed: Aug. 21, 2012

(65) Prior Publication Data

US 2013/0236658 A1    Sep. 12, 2013

(30) Foreign Application Priority Data

Mar. 8, 2012    (JP) .................................. 2012-051748

(51) Int. Cl.
| | | |
|---|---|---|
| *B05D 1/36* | (2006.01) | |
| *B05D 3/10* | (2006.01) | |
| *G03F 7/00* | (2006.01) | |
| *B05D 3/14* | (2006.01) | |

(52) U.S. Cl.
CPC ................. *G03F 7/0002* (2013.01); *B05D 1/36* (2013.01); *B05D 3/10* (2013.01); *B05D 3/141* (2013.01)

(58) Field of Classification Search
None
See application file for complete search history.

(56) References Cited

U.S. PATENT DOCUMENTS

| | | | | |
|---|---|---|---|---|
| 5,514,501 | A | * | 5/1996 | Tarlov ............................... 430/5 |
| 8,114,306 | B2 | | 2/2012 | Cheng et al. |
| 2010/0297847 | A1 | | 11/2010 | Cheng et al. |

FOREIGN PATENT DOCUMENTS

| | | |
|---|---|---|
| JP | 2010-189748 | 9/2010 |
| JP | 2010-269304 | 12/2010 |
| JP | 2011-78978 | 4/2011 |
| JP | 2011-125934 | 6/2011 |

OTHER PUBLICATIONS

Cheng, J. Y. et al., "Dense Self-Assembly on Sparse Chemical Patterns: Rectifying and Multiplying Lithographic Patterns Using Block Copolymers," Adv. Mater., vol. 20, pp. 3155-3158, (2008).

* cited by examiner

*Primary Examiner* — William Phillip Fletcher, III
(74) *Attorney, Agent, or Firm* — Finnegan, Henderson, Farabow, Garrett & Dunner, L.L.P.

(57) ABSTRACT

According to one embodiment, a pattern formation method includes: forming a cyclic pattern having first strips of a first polymer component and second strips of a second polymer component by forming chemical guides having affinity for the first polymer component on a substrate to be processed and coating a directed self-assembly material comprising the first polymer component and the second polymer component on the substrate to be processed. In this pattern formation method, the chemical guides comprise a plurality of regions arrayed in matrix with a predetermined interval on the substrate to be processed; each of the regions has a symmetrical shape with respect to a centerline of the region, the centerline extends in the first direction; and a width along the first direction of the region is narrowed from the centerline toward each of end parts of the region.

18 Claims, 13 Drawing Sheets

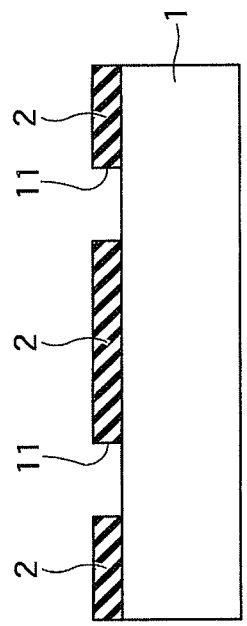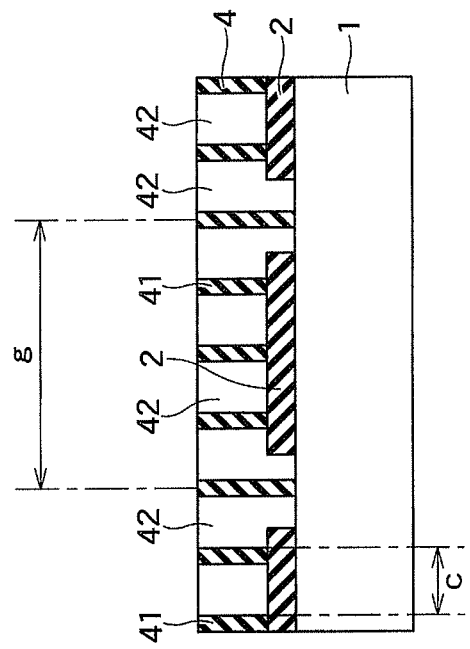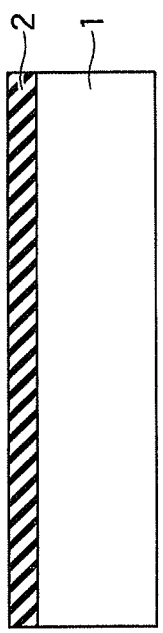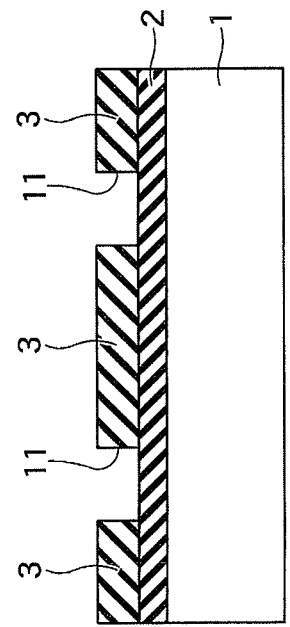

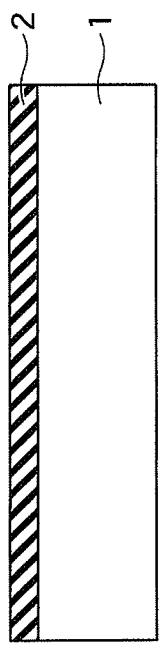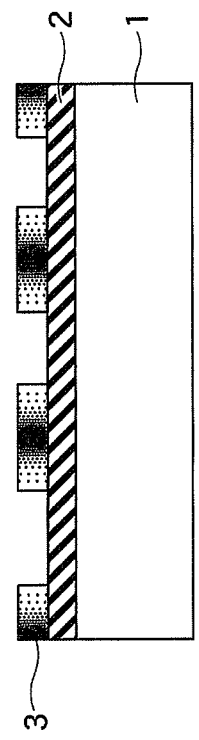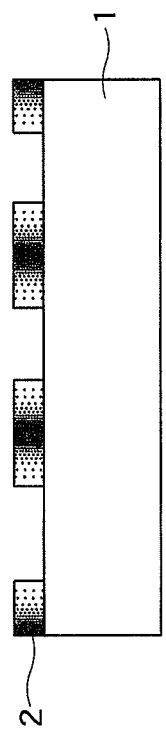
FIG. 7A
FIG. 7B
FIG. 7C

PATTERN FORMATION METHOD

CROSS-REFERENCE TO RELATED APPLICATION

This application is based upon and claims the benefit of priority from prior Japanese Patent Application No. 2012-51748, filed on Mar. 8, 2012, the entire contents of which are incorporated herein by reference.

FIELD

Embodiments of the present invention relate to a pattern formation method.

BACKGROUND

In conventional semiconductor device production processes such as an LSI production process, microfabrication technology employing lithography in which a micro pattern is transferred by exposing a photosensitive material called photoresist to light using an exposure device has been employed. Therefore, in the case where a more micro pattern is desired, it is necessary to achieve a shorter wavelength of the exposure device, higher performance of the resist, and the like. However, it is considered that these improvements are of limited effectiveness.

Accordingly, as a method for forming the more micro pattern, self-assembly lithography which exploits a self-assembly phenomenon of a polymer material such as a block copolymer for attaining spontaneous formation of a micro and regular pattern has been proposed.

For instance, as one example of the self-assembly lithography in the case of forming a pattern made from a directed self-assembly (DSA) material on a substrate surface, there has been proposed a method of forming on the substrate surface regions (chemical guides) having chemical affinity for one of a plurality of polymer components contained in a self-assembly material in the form of a straight line or a dotted line and settling orientation of the pattern formed of the self-assembly material owing to the chemical guides.

BRIEF DESCRIPTION OF THE DRAWINGS

FIG. 1A to FIG. 1D are diagrams for illustrating a pattern formation method according to a first embodiment;

FIG. 7A to FIG. 7C are diagrams for illustrating a pattern formation method according to a second embodiment;

DETAILED DESCRIPTION

Figure 2:
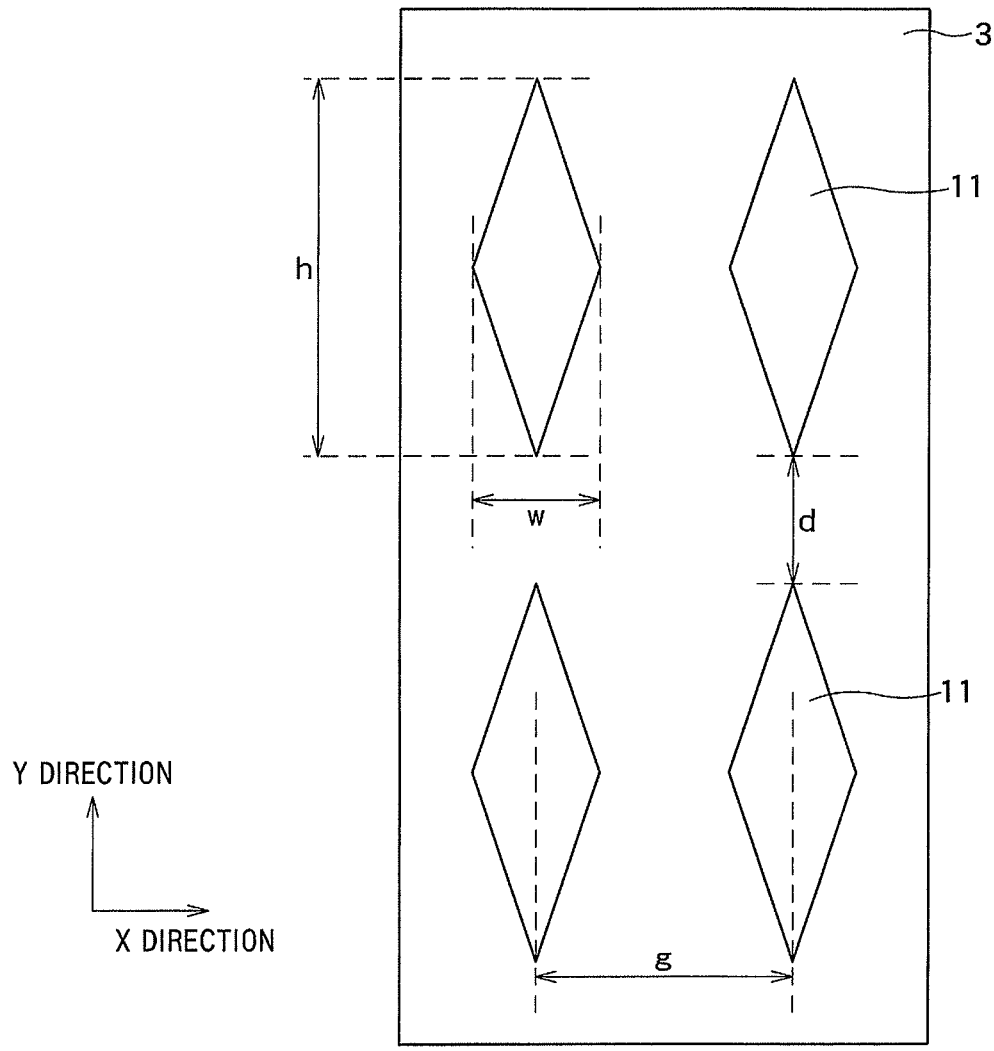
FIG. 2 is a diagram for illustrating the pattern formation method according to the first embodiment.

In one embodiment, a pattern formation method includes: forming a cyclic pattern in which first strips comprising a first polymer component and second strips comprising a second polymer component, each of which extends in a first direction, are alternately aligned along a second direction which is perpendicular to the first direction by forming chemical guides having affinity for the first polymer component on a substrate to be processed and coating a directed self-assembly material comprising the first polymer component and the second polymer component on the substrate to be processed. In this pattern formation method, the chemical guides comprise a plurality of regions arrayed in matrix with a predetermined interval on the substrate to be processed; each of the regions has a symmetrical shape with respect to a centerline of each of the regions, the centerline extends in the first direction; and a width along the first direction of each of the regions is narrowed from the centerline toward each of end parts of the region.

Hereafter, the embodiments will be described with reference to the drawings. It should be understood that the present invention is not limited to the embodiments. The parts common in the drawings are denoted by an identical reference numeral, and overlapping description is not repeated. Also, the drawings are pattern diagrams for the purposes of illustration and understanding of the invention, and some of shapes, dimensions, ratios, and the like of the drawings are different from those of an actual device and can be modified as required by taking the following description and known art into consideration. In the embodiments described below, a case of using PS-b-PMMA (polystyrene-b-polymethylmethacrylate) as a self-assembly material will be described.

First Embodiment

A pattern formation method according to the present embodiment will be described by using FIG. 1A to FIG. 1D. FIG. 1A to FIG. 1D are sectional views showing process steps of the present embodiment. Here, a process of forming a pattern made from a self-assembly material by forming chemical guides on a substrate to be processed will be described as one example, and the present invention is not limited to the embodiment.

As shown in FIG. 1A, a neutral film 2 is coated on a surface of a substrate to be processed 1 by employing spin coating or the like. The surface of the substrate to be processed 1 has chemical affinity for one (hereinafter referred to as "first polymer component") of a plurality of polymer components contained in a self-assembly material. The neutral film 2 is a film having substantially identical chemical affinity for the polymer components contained in the self-assembly material. In the following description, the self-assembly material is described as the one containing two types of polymer components and first and second polymer components 41 and 42. Examples of the first and second polymer components 41 and 42 include polystyrene (PS) and polymethylmethacrylate (PMMA).

Next, as shown in FIG. 1B, a photoresist 3 is patterned in the form described below by coating the photoresist 3 on the neutral film 2 and performing exposure and development.

As the pattern formed on the photoresist 3, a plurality of vertically long rhombus-shaped openings 11 are formed as shown in FIG. 2, for example. As shown in FIG. 2 which is a plan view showing the photoresist 3, the plurality of rhombus-shaped openings 11 are arranged with a predetermined interval in such a manner that a long diagonal line h of each of the openings 11 (distance between upper and lower ends of rhombus-shaped opening 11 in FIG. 2) (first diagonal line) is along a predetermined direction (direction Y in FIG. 2) (first direction). In each of the openings 11, the long diagonal line h is longer than a short diagonal line W (distance between right and left ends of rhombus-shaped opening 11 in FIG. 2) (second diagonal line), and an angle of each of tips extending in a direction of the long diagonal line h (upper and lower tips in FIG. 2) may preferably have a sharp angle, for example, to satisfy a relationship of 2W<h<6W between the long diagonal line h and the short diagonal line W. Also, a distance d between the openings 11 adjacent to each other along the direction Y (distance between the upper and lower ends of each of the openings 11 which are adjacent one above the other in FIG. 12) may preferably be equal to a length of the long diagonal line h or may preferably be shorter than the length of the long diagonal line h. Further, the pattern is formed in such a manner that a distance g between the centers of the openings 11 adjacent to each other along a direction X (distance between the centerlines of each of the openings 11 which are adjacent side to side in FIG. 2) is an integral multiple of a width of one cycle of the self-assembly material pattern to be formed.

Figure 3A:
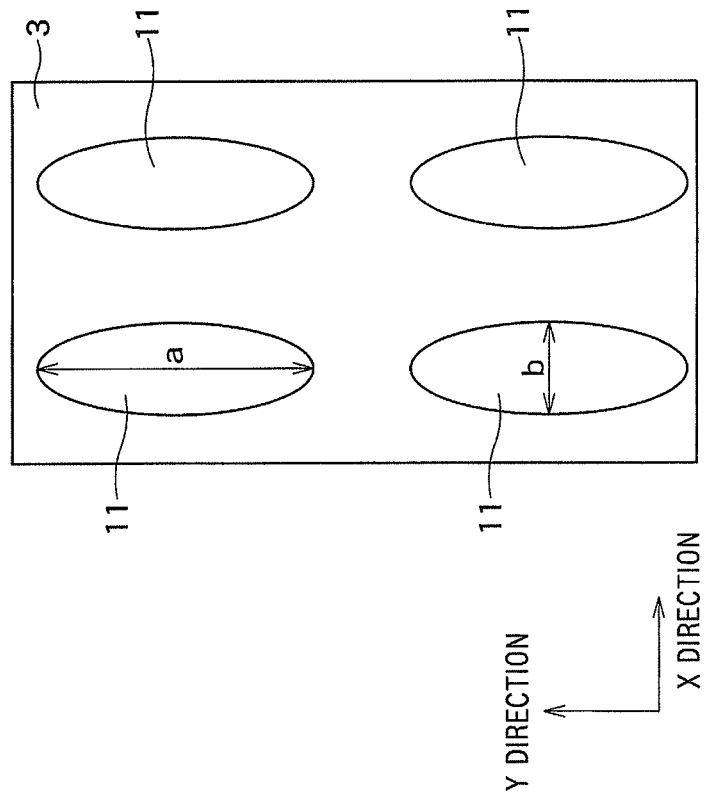
FIG. 3A and FIG. 3B are diagrams for illustrating the pattern formation method according to the first embodiment.

As another pattern to be formed on the photoresist 3, the one in which rhombus-shaped openings 11 adjacent to each other along a direction Y are connected at upper and lower ends may be formed as shown in FIG. 3A which is a plan view showing the photoresist 3. However, in this case, a width V of the connection part of the openings 11, which is along a short diagonal line W (distance between left and right ends of rhombus-shaped opening 11 in FIG. 3A), may preferably be shorter than a length of the short diagonal line W.

Figure 3B:
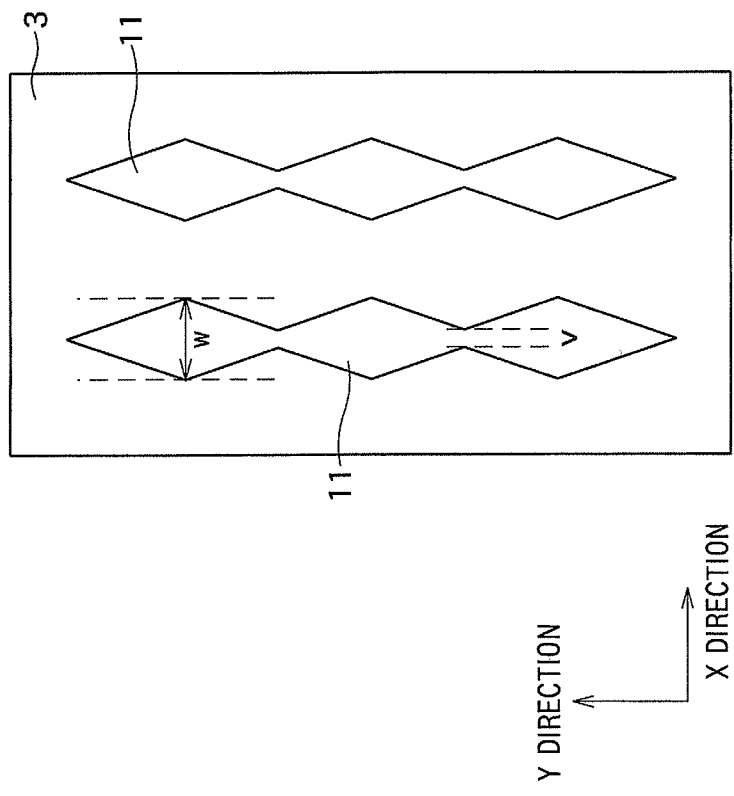

As yet another pattern to be formed on the photoresist 3, the one in which each of openings 11 has an oval shape may be formed as shown in FIG. 3B which is a plan view showing the photoresist 3. In this case, the plurality of openings 11 are arranged in such a manner that a long axis a of each of the oval openings 11 is along a predetermined direction (direction Y in FIG. 3B). Therefore, a short axis b of the opening 11, which is shorter than the long axis a, is along a direction (direction X in FIG. 3B) (second direction) perpendicular to the predetermined direction.

It is satisfactory when the openings 11 of the photoresist 3 are arrayed in matrix with a predetermined interval, and the shape of the openings 11 is not particularly limited insofar as the shape does not deviate from the one described below. Each of the openings 11 has a shape which is symmetrical with respect to a centerline which is along a predetermined direction (direction Y), and a width of each of the openings 11 along the predetermined direction is narrowed from the centerline toward each of the end parts of the opening 11. The reason for the shape will be described later in this specification. Also, a diagonal line or a curved line as an outline of the opening 11 may have micro steps depending on accuracy of photolithography. In the following description, the example in which the opening 11 has the rhombus shape will be described.

Next, dry etching or wet etching is performed on the neutral film 2 by using the photoresist 3 as a mask on which the above-described patterning is performed to form the openings 11 on the neutral film 2 according to the pattern of the photoresist 3. Next, the photoresist 3 is removed. Thus, a state in which the surface of the substrate to be processed 1 is exposed from the openings 11 of the neutral film 2 shown in FIG. 1C is attained. Since the surface of the substrate to be processed 1 exposed from each of the openings 11 has affinity for one (the first polymer component in this case) of the polymer components contained in the self-assembly material, the surface serves as a chemical guide which exerts action on the polymer component.

Then, as shown in FIG. 1D, a cyclic pattern having orientation defined by the chemical guides each formed of the surface of the substrate to be processed 1 exposed from the openings 11 is formed by applying the self-assembly material 4 on the substrate to be processed 1. More specifically, in the case where the self-assembly material 4 contains the first polymer components 41 and the second polymer components 42, for example, the pattern to be formed is a cyclic pattern in which first strips formed of the first polymer component 41 and second strips formed of the second polymer component 42, each of which extends in the predetermined direction (direction Y) and has a predetermined width, are alternately arranged along a direction (direction X) perpendicular to the predetermined direction. As described in the foregoing, the distance g between the centers of the chemical guides adjacent to each other along the direction X is an integral multiple of a width c of one cycle of the self-assembly material pattern to be formed.

As described above, according to the present embodiment, it is possible to uniquely define the positions of the first and second strips in the pattern formed of the self-assembly material and to prevent misalignment in the pattern by forming the chemical guides each having the rhombus shape or the like, not the strip-like rectangular shape. Details of the present embodiment will be described below.

Figure 4:
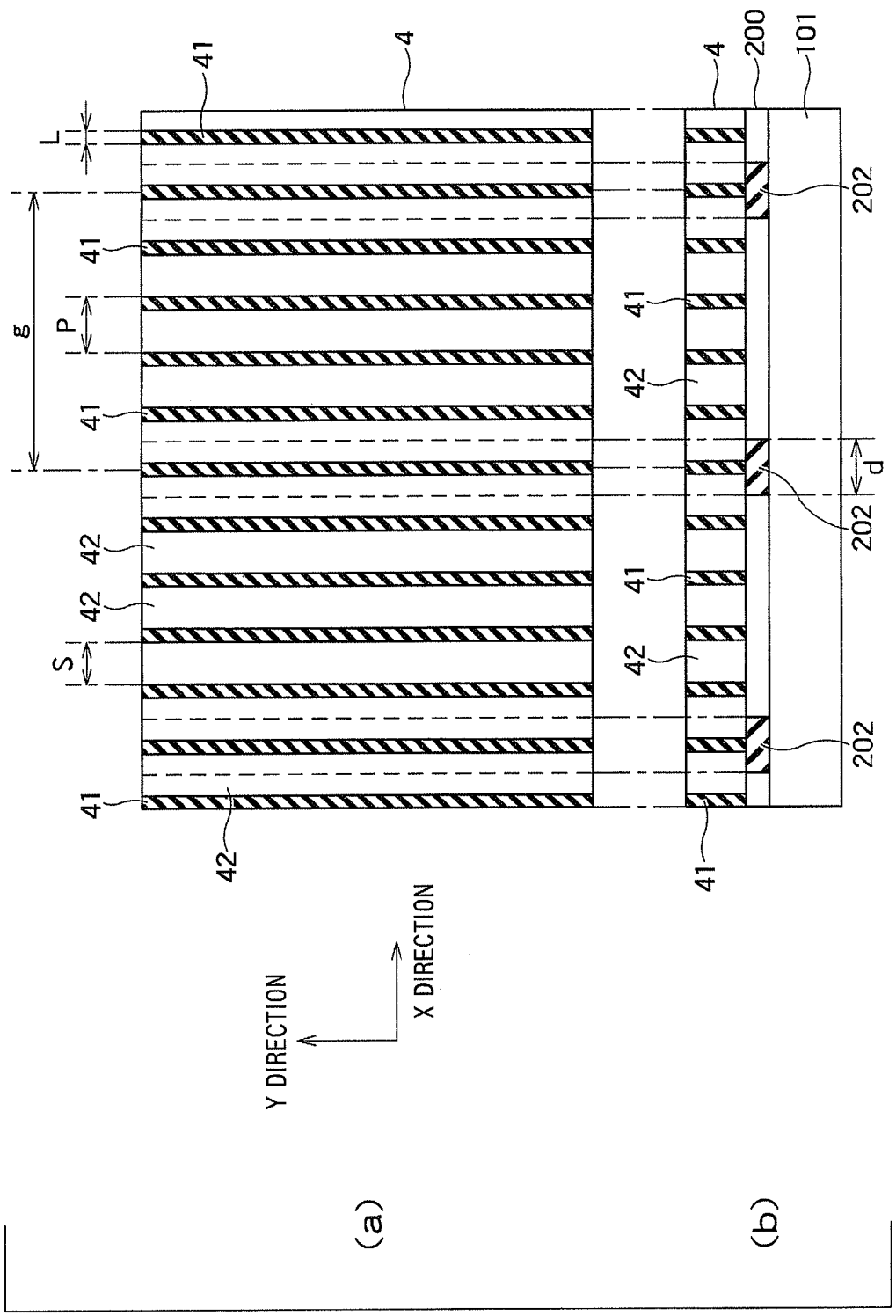
FIG. 4 to FIG. 5 are diagrams for illustrating a pattern formation method according to a comparative example.
Figure 5:
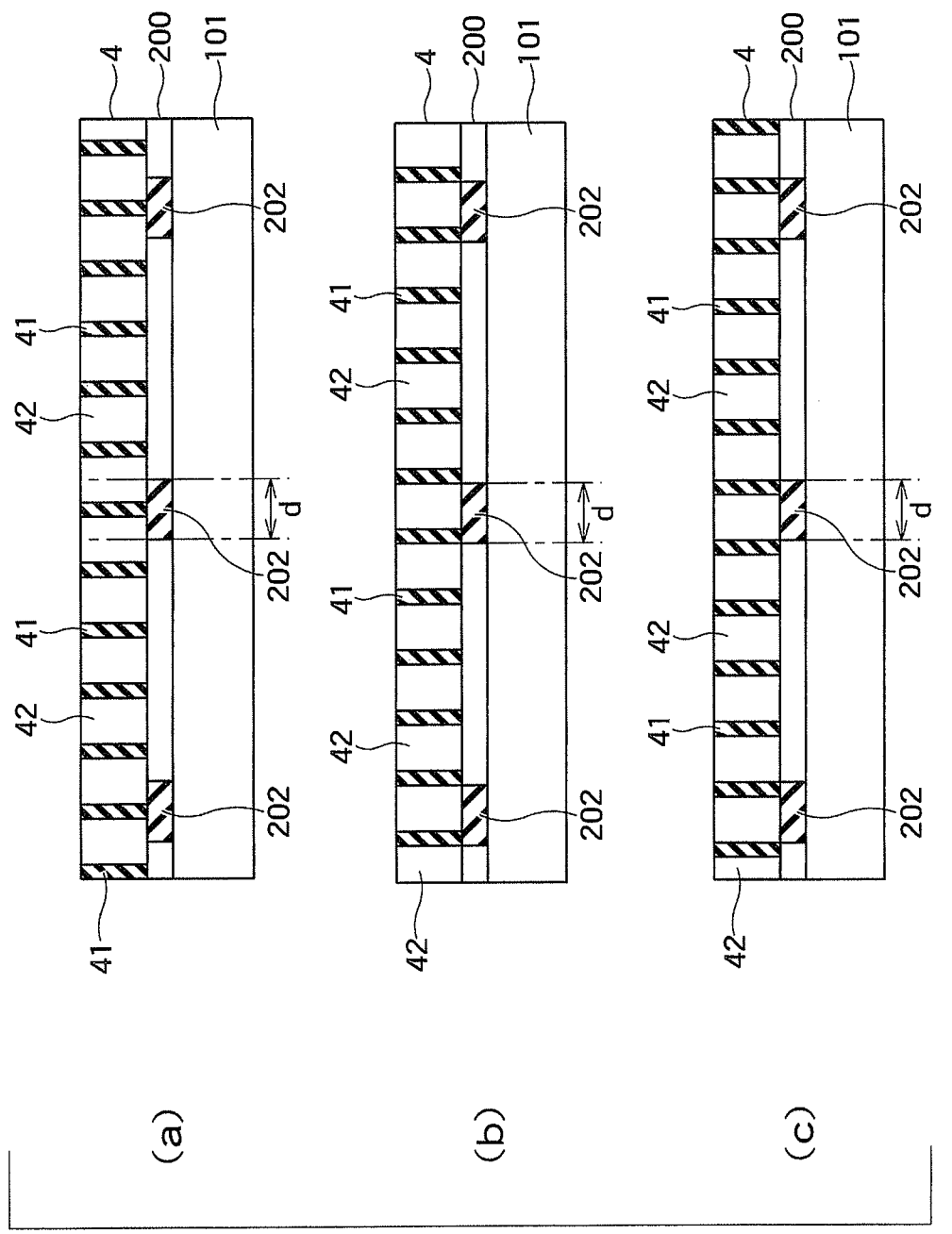

Before describing the present embodiment, one example of pattern formation methods performed by the inventor will be described as a comparative example by using FIG. 4 and FIG. 5. Shown in FIG. 4 is a pattern formed by the pattern formation method of the comparative example, in which, more specifically, FIG. 4(a) is a top view of the pattern, and FIG. 4(b) is a sectional view of the pattern. In the comparative example, a chemical guide layer 200 having a strip pattern is formed on a substrate to be processed 101 as shown in FIG. 4. The chemical guide layer 200 has affinity for a first polymer component 41 contained in a self-assembly material 4 and has chemical guides 202 each having a rectangular shape in the form of a strip along a direction Y. In this case, the chemical guides 202 are formed in such a manner that a distance g between centers of the chemical guides 202 adjacent to each other along a direction X is an integral multiple of a width P (a sum of a width L of the first strip made from the first polymer component 41 and a width S of the second strip made from a second polymer component 42) of one cycle of a self-assembly material pattern to be formed. With such configuration, it is possible to obtain the regular cyclic pattern formed of the first strips made from the first polymer component 41 and the second strips made from the second polymer component 42 extending along the direction Y in the case where the self-assembly material 4 containing the first polymer component 41 and the second polymer component 42 is coated on the chemical guide layer 200. Here, the chemical guides 202 are formed in such a manner that the width d of each of the chemical guides 202 satisfies a relationship of d<2S+L so that there are two or less strips made from the first polymer component 41 on the chemical guide 202.

However, since the patterning is generally performed by employing photolithography, the chemical guides 202 have a certain length as the width. Therefore, various patterns are formed as shown in FIG. 5 in which sectional views of the patterns formed by the pattern formation method of the comparative example are shown. More specifically, though a pattern in which each of the first strips made from the first polymer component 41 is positioned on the center of each of the chemical guides 202 is preferred (see FIG. 5(a)), the first strip made from the first polymer component 41 is sometimes misaligned from the center of the chemical guide 202 (see FIGS. 5(b) and 5(c)). Since the arbitrary misalignment corresponding to the width d of the chemical guide 202 occurs in the pattern formed of the self-assembly material 4 to be obtained, the positions in the pattern are not uniquely decided. Such state can be a cause of a reduction of yield especially in the case of desiring to form micro pattern with high accuracy and is therefore problematic.

Figure 6B:
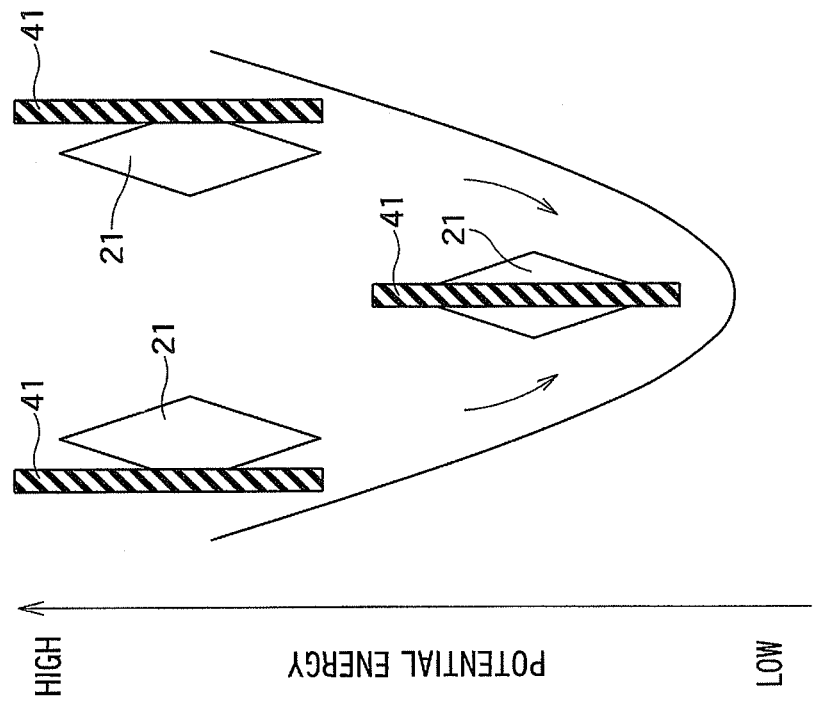
FIG. 6A and FIG. 6B are diagrams for illustrating the pattern formation method according to the first embodiment.
Figure 6A:
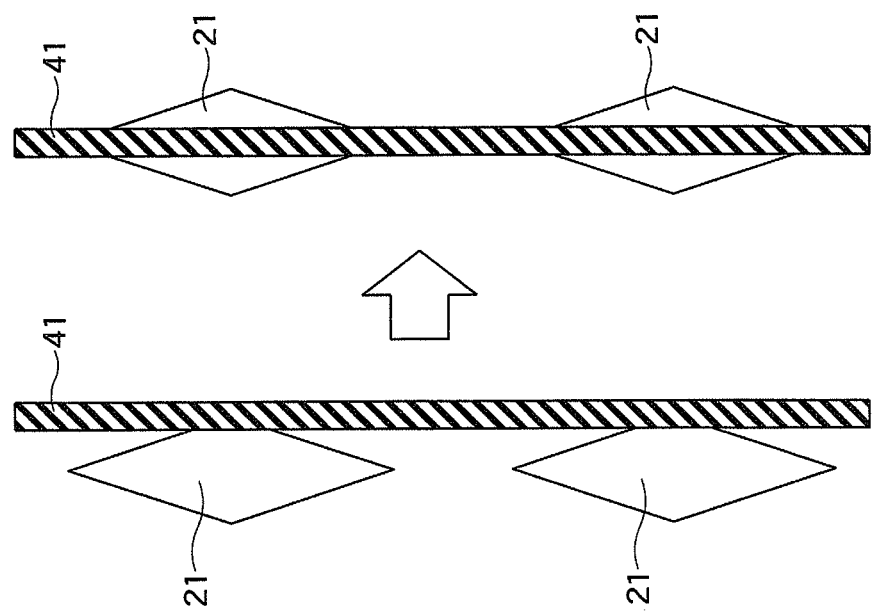

By the way, in the case where the self-assembly material 4 is coated on the chemical guide 21 having affinity for the first polymer component 41 contained in the self-assembly material, the first polymer material 41 autonomously moves in a direction in which an area overlapping with the chemical guide 21 becomes maximum so that potential energy is reduced. Therefore, since the chemical guide 21 has the shape by which the area increases in a certain direction in the present embodiment, i.e. has the rhombus shape or the oval shape as described in the foregoing, the first polymer component 41 autonomously moves in a direction in which the area overlapping with the surface of the chemical guide 21 becomes maximum as shown in FIG. 6A. In other words, the first polymer component 41 autonomously moves so that the potential energy is reduced as shown in FIG. 6B. Therefore, in the present embodiment, it is possible to uniquely decide the positions of the first polymer component 41 and to prevent misalignment of the positions.

Also, in the present embodiment, in the case where the chemical guide 21 has the rhombus shape, the long diagonal line h of the rhombus shape is preferably longer than the short diagonal line W; the tip extending in the direction of the long diagonal line h preferably has the angle which is as sharp as possible; and the relationship between the long diagonal line h and the short diagonal line W is 2W<h<6W as described in the foregoing. By forming the shape in which the width along the long diagonal line h extremely changes as described above, misalignment of the first polymer component 41 is much more reduced.

Also, in the present embodiment, in the case where each of the chemical guides 21 has the rhombus shape, the chemical guides 21 are aligned in such a manner that the long diagonal line h of the rhombus shape is along the direction (direction Y) of extension of the first strips to be formed which is made from the first polymer component. Further, the distance d between the chemical guides 21 adjacent to each other along the direction Y is preferably equal to or shorter than the length of the long diagonal line h. With such configuration, it is possible to avoid misalignment of the direction of extension of the first strips made from the first polymer component.

According to the pattern formation method of the present embodiment, it is possible to autonomously and uniquely define the positions in the self-assembly material pattern to be formed in the self-aligned manner and to prevent misalignment of the positions.

Second Embodiment

The present embodiment is different from the first embodiment by the feature of forming chemical guides having a gradation pattern with the use of a grayscale mask (a photomask including a pattern with a gradation grayscale). By the feature, chemical guides having a desired shape are easily formed.

A pattern formation method according to the second embodiment will be described by using FIG. 7A to FIG. 7C and FIG. 8. In the following description, detailed description of the parts common to the first embodiment is not repeated. Hereinafter, a process of forming a pattern made from a self-assembly material by forming chemical guides on a substrate to be processed will be described as one example, and the present invention is not limited to the embodiment as is the case with the first embodiment.

In the same manner as in the first embodiment, a neutral film 2 is coated on a surface of a substrate to be processed 1 as shown in FIG. 7A. The surface of the substrate to be processed 1 has chemical affinity for a first polymer component contained in a self-assembly material. The neutral film 2 is a film having substantially identical chemical affinity for polymer components contained in the self-assembly material.

Next, as shown in FIG. 7B, a gradation pattern is formed in a photoresist 3 by coating the photoresist 3 on the neutral film 2 and performing exposure and development with the use of a grayscale mask (not shown).

Figure 8:
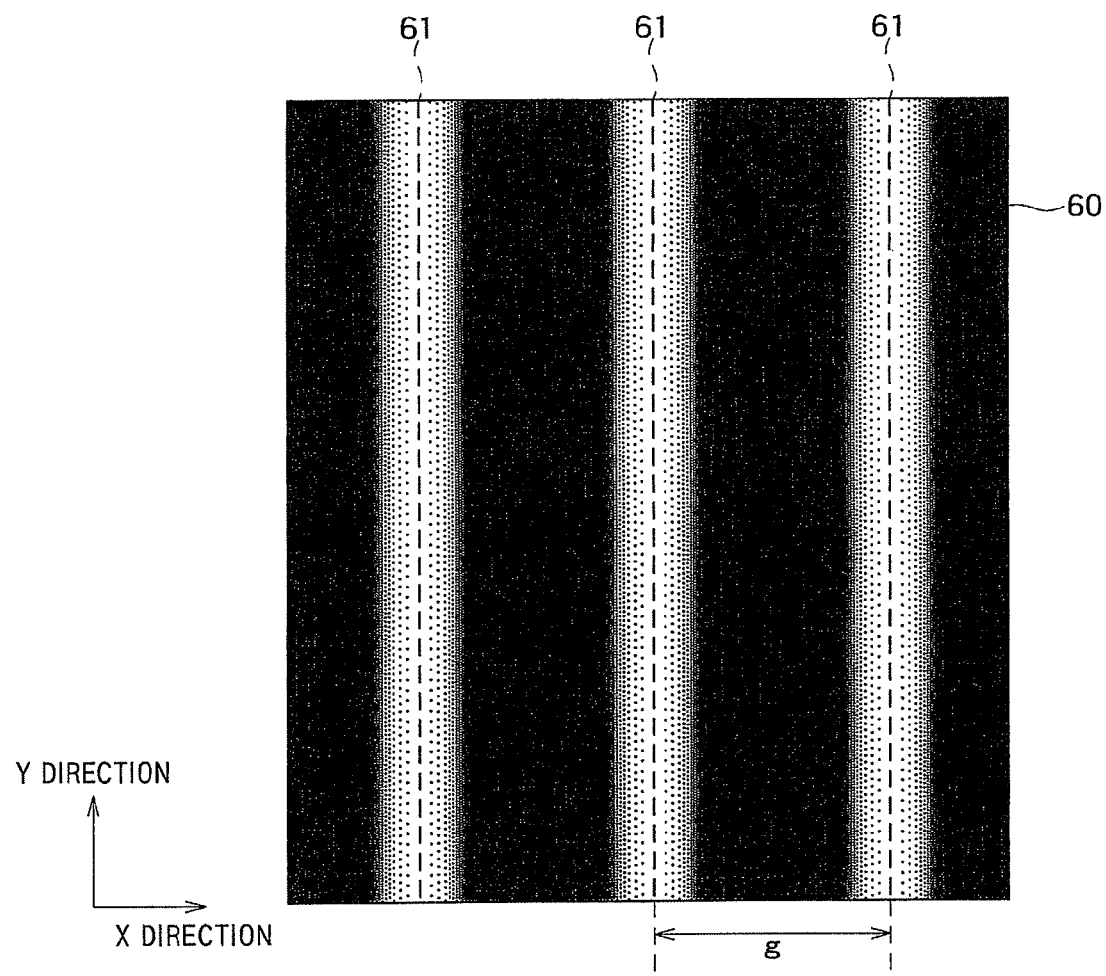
FIG. 8 to FIG. 10 are diagrams for illustrating the pattern formation method according to the second embodiment.

A grayscale mask 60 to be used has a gradation grayscale as shown in a top view of FIG. 8, and, more specifically, the gradation is symmetrical with respect to a virtual centerline 61 which extends along a desired direction (direction Y in FIG. 8) and gets lighter with distance from the centerline 61. A distance g between centerlines 61 which are adjacent to each other along a direction (direction X in FIG. 8) perpendicular to the desired direction is an integral multiple of a width of one cycle of the self-assembly material pattern to be formed. With the use of the grayscale mask 60 having the gradation grayscale, it is possible to control a light transmission amount during the exposure, and, specifically, it is possible to three-dimensionally form the photoresist 3 by deeply exposing the photoresist 3 at the part of large light transmission amount and shallowly exposing the photoresist 3 at the part of small light transmission amount. More specifically, in the photoresist 3 after the exposure and development, the parts which received the large amount of light become openings, and each of parts beside each of the openings is gradually thickened with distance from the opening to cover the neutral film 2.

Next, etching is performed on the neutral film 2 by using the photoresist 3 as a mask to form a gradation pattern on the neutral film 2 according to the pattern of the photoresist 3 in the same manner as in the first embodiment. Next, the photoresist 3 is removed. Thus, a state shown in FIG. 7C is attained.

Figure 9:
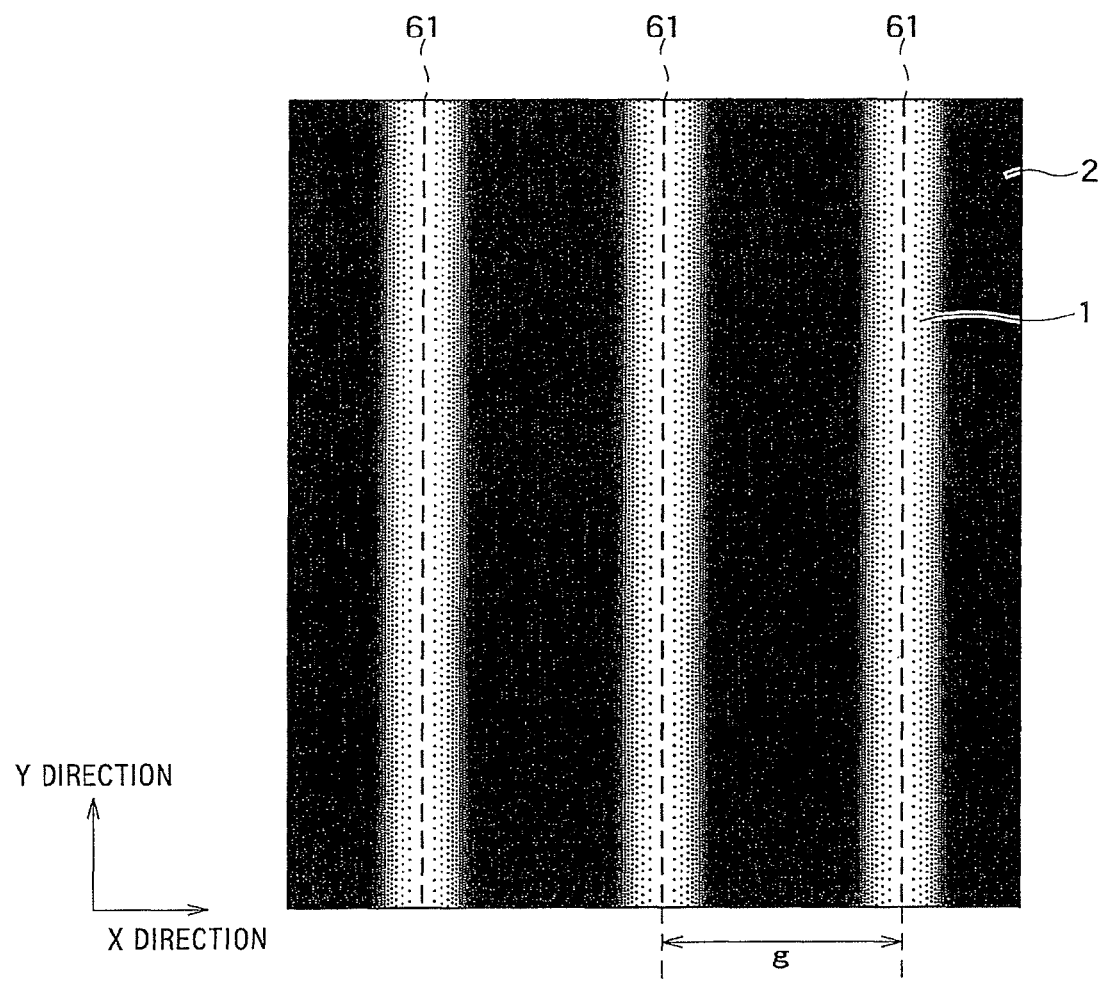

More specifically, as shown in a top view of the neutral film 2 of FIG. 9, the part of the virtual centerline 61 of the neutral film 2 has a wide area, and the surface of the substrate to be processed 1 is exposed from the part of the virtual centerline 61 (white part in FIG. 9). Also, a plurality of pinholes are formed on the neutral film 2, and the pinholes are distributed symmetrically with respect to the centerline 61 with the distribution being dense around the centerline 61 and sparse as distance from the centerline 61. Further, the surface of the substrate to be processed 1 having affinity for the first polymer component is exposed from each of the pinholes. Therefore, since the exposed surfaces of the substrate to be processed 1 serve as the chemical guides, the areas of the exposed surfaces of the substrate to be processed 1 which exert action on the first polymer component are gradually changed, i.e. the chemical guides which are gradually thickened toward the centerline are obtained. As shown in FIG. 9, in the chemical guides, a distance g between the centerlines 61 which are adjacent to each other along a direction (direction X in FIG. 9) perpendicular to a desired direction is an integral multiple of a width of one cycle of the self-assembly material pattern to be formed as described above.

Then, by coating the self-assembly material 4 on the substrate to be processed 1 in the same manner as in the first embodiment, a cyclic pattern having orientation defined by the chemical guides each formed of the surface of the substrate to be processed 1 exposed is formed, and detailed description thereof is omitted herein since it is the same as that of the first embodiment.

As described above, according to the present embodiment, it is possible to uniquely define the positions in the pattern formed of the self-assembly material and to prevent misalignment in the pattern by forming the chemical guides in the gradation pattern.

Figure 10:
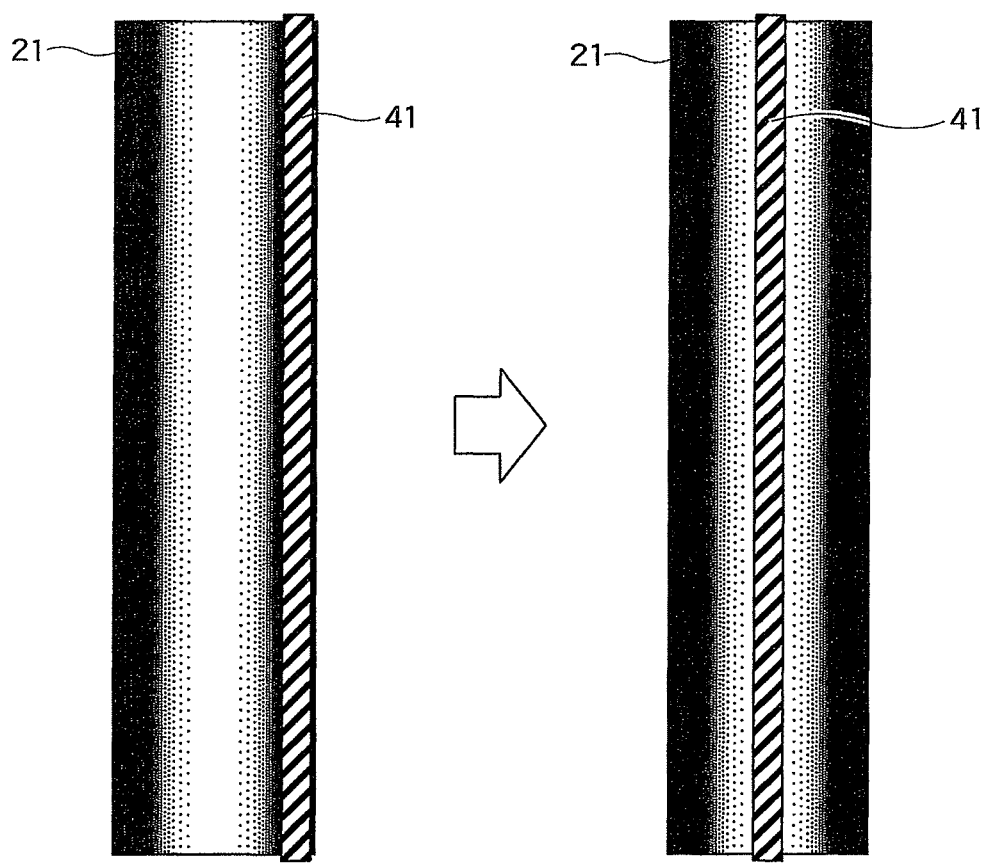

More specifically, the first polymer material 41 contained in the self-assembly material autonomously moves in a direction in which an area overlapping with the chemical guide becomes maximum so that potential energy is reduced. Therefore, since the areas of the chemical guides which exert action on the polymer component are gradually changed in the present embodiment, the first polymer component 41 autonomously moves in a direction in which the area overlapping with the chemical guide having the affinity for the first polymer component 41 becomes maximum as shown in FIG. 10. Therefore, it is possible to uniquely decide the positions of the first polymer component 41 and to prevent misalignment of the positions. In the present embodiment, it is preferable that a width of the region having wide area where the surface of the substrate to be processed 1 is exposed is as narrow as possible, and, with such configuration, it is possible to uniquely decide the positions of the first polymer component 41 with high accuracy and to prevent misalignment of the positions.

Third Embodiment

The present embodiment is different from the first and second embodiments by the feature of forming chemical guides by forming an organic material film 5 in place of the neutral film 2 and treating a surface of the organic material film 5. By the feature, it is possible to obtain desired chemical guides irrespective of properties of a surface of a substrate to be processed.

A pattern formation method according to the third embodiment will be described by using FIG. 11A to FIG. 11D. In the following description, detailed description of the parts common to the first and the second embodiments is not repeated. Hereinafter, a process of forming a pattern made from a self-assembly material by forming chemical guides on a substrate to be processed will be described as one example, and the present invention is not limited to the embodiment as is the case with the first and second embodiments.

Figure 11A:
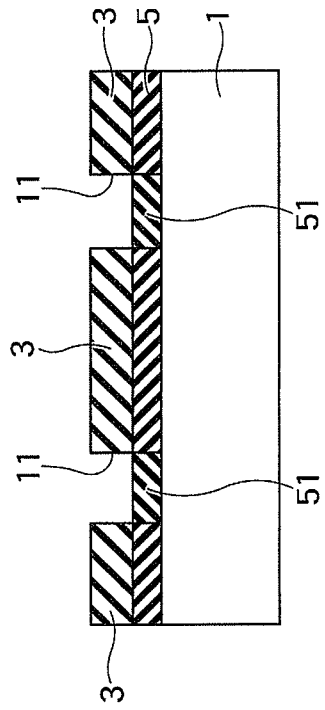
FIG. 11A to FIG. 11D are diagrams for illustrating a pattern formation method according to a third embodiment.

As shown in FIG. 11A, an organic material film 5 is formed on a surface of a substrate to be processed 1. The organic material film is made from PS, for example. In the present embodiment, the substrate to be processed 1 is not limited to those having affinity for a first polymer component contained in a self-assembly material.

Figure 11B:
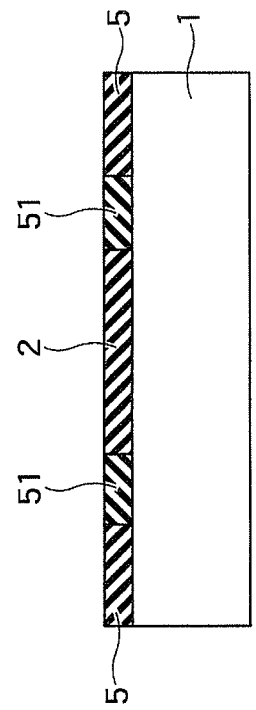

Next, as shown in FIG. 11B, patterning is performed on a photoresist 3 so as to form a pattern same as that of the first embodiment, such as the pattern with the rhombus-shaped openings, by coating the photoresist 3 on the organic material film 5 and performing exposure and development. The shape of each of the openings in the photoresist 3 is not limited to the rhombus shape as is the case with the first embodiment, and it is satisfactory that the shape is symmetrical with respect to a centerline along a predetermined direction (direction Y), and that a width along the predetermined direction is narrowed from the centerline toward each of the end parts.

Figure 11C:
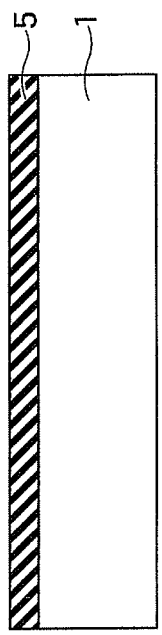

Further, as shown in FIG. 11C, surface-treated regions 51 corresponding to the pattern of the photoresist 3 are formed by performing a surface treatment on a surface of the organic material film 5 by using the patterned photoresist 3 as a mask.

Figure 11D:
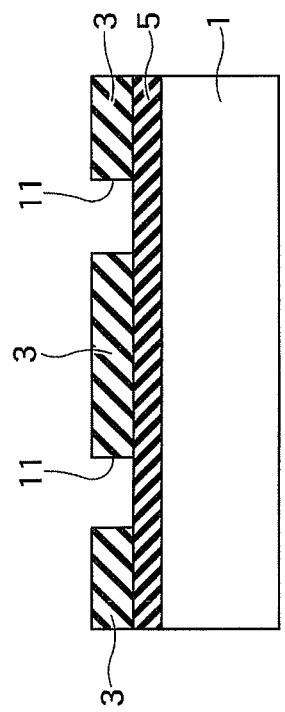

For example, the surface of the organic material film 5 exposed from each of openings 11 of the photoresist 3 is exposed to oxygen plasma to be oxidated. Since the thus-oxidated surface-treated regions 51 which are made from PS have affinity for PMMA of the two polymer components contained in the self-assembly material, the regions 51 can serve as the chemical guides. FIG. 11D is obtained by eliminating the photoresist 3.

Then, by coating the self-assembly material 4 on the substrate to be processed 1 in the same manner as in the first embodiment, a cyclic pattern having orientation defined by the chemical guides each formed of the surface-treated region 51 is formed, and detailed description thereof is omitted herein since it is the same as that of the first embodiment.

As described above, according to the pattern formation method of the present embodiment, it is possible to autonomously and uniquely define the positions in the self-assembly material pattern to be formed in the self-aligned manner and to prevent misalignment of the positions.

In the present embodiment, the plasma oxidation treatment is not limitative, and other surface treatments which are capable of causing the surface of the organic material film 5 to have the affinity for one of the plurality of polymer components forming the self-assembly material may be employed.

Fourth Embodiment

The present embodiment is different from the first to third embodiments by the feature of forming chemical guides having a gradation pattern by forming an organic material film 5 in place of the neutral film 2 and performing a surface treatment with the use of a photoresist formed by using a grayscale mask. By the feature, it is possible to easily obtain desired chemical guides irrespective of properties of a surface of a substrate to be processed.

A pattern formation method according to the fourth embodiment will be described by using FIG. 12A to FIG. 12D. In the following description, detailed description of the parts common to the first to third embodiments is not repeated. Hereinafter, a process of forming a pattern made from a self-assembly material by forming chemical guides on a substrate to be processed will be described as one example, and the present invention is not limited to the embodiment as is the case with the first to third embodiments.

Figure 12A:
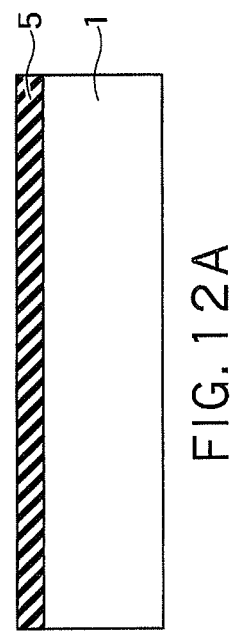
FIG. 12A to FIG. 12D are diagrams for illustrating a pattern formation method according to a fourth embodiment.

As shown in FIG. 12A, an organic material film 5 is formed on a surface of a substrate to be processed 1 in the same manner as in the third embodiment. The organic material film 5 is made from PS, for example. In the present embodiment, the surface of the substrate to be processed 1 is not limited to those having affinity for a first polymer component contained in a self-assembly material.

Figure 12B:
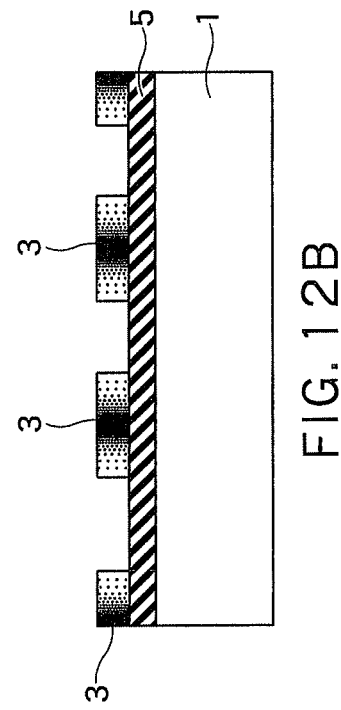

Next, as shown in FIG. 12B, a photoresist 3 is coated on the organic material film 5 in the same manner as in the second embodiment, and then a gradation pattern is formed in the photoresist 3 by using a grayscale mask (not shown).

Figure 12C:
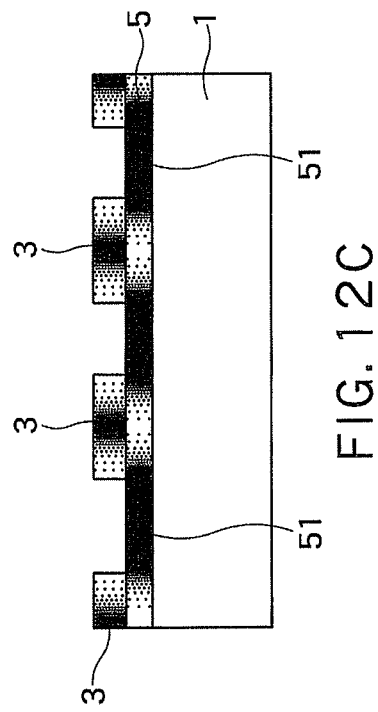
Figure 12D:
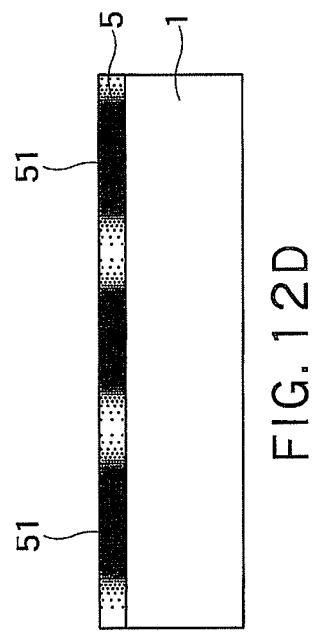

Further, as shown in FIG. 12C, gradient surface-treated regions 51 are formed by performing a surface treatment on a surface of the organic material film 5 by using the patterned photoresist 3 as a mask in the same manner as in the third embodiment. For example, the surface of the organic material film exposed from each of openings (pinholes) of the photoresist 3 having the gradation pattern is exposed to oxygen plasma to be oxidated. Since the thus-oxidated surface-treated regions 51 which are made from PS have affinity for PMMA of the two polymer components contained in the self-assembly material, the regions 51 can serve as the chemical guides. FIG. 12D is obtained by eliminating the photoresist 3.

Further, by coating the self-assembly material 4 on the substrate to be processed 1 in the same manner as in the first embodiment, a cyclic pattern having orientation defined by the chemical guides each formed of the surface-treated region 51 is formed, and detailed description thereof is omitted herein since it is the same as that of the first embodiment.

As described above, according to the pattern formation method of the present embodiment, it is possible to autonomously and uniquely define the positions in the self-assembly material pattern to be formed in the self-aligned manner and to prevent misalignment of the positions.

In the present embodiment, the plasma oxidation treatment is not limitative as is the case with the third embodiment, and other surface treatments which are capable of causing the surface of the organic material film 5 to have the affinity for one of the plurality of polymer components forming the self-assembly material may be employed.

Fifth Embodiment

The present embodiment is different from the first to fourth embodiments by the feature of forming chemical guides having a desired shape directly on a substrate to be processed by a method such as coating. By the feature, it is possible to easily obtain the chemical guides with the reduced number of process steps.

A pattern formation method according to the fifth embodiment will be described by using FIG. 13A and FIG. 13B. In the following description, detailed description of the parts common to the first to fourth embodiments is not repeated. Hereinafter, a process of forming a pattern made from a self-assembly material by forming chemical guides on a substrate to be processed will be described as one example, and the present invention is not limited to the embodiment as is the case with the first to fourth embodiments.

Figure 13B:
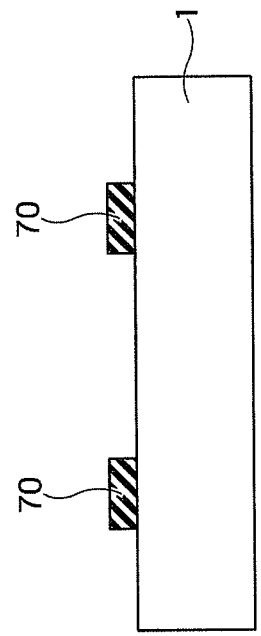
FIG. 13A and FIG. 13B are diagrams for illustrating a pattern formation method according to a fifth embodiment.
Figure 13A:
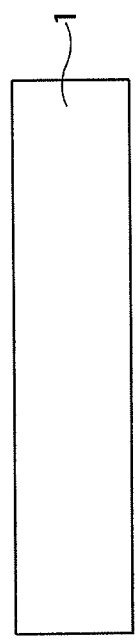

As shown in FIG. 13A, a substrate to be processed 1 is prepared. A surface of the substrate to be processed 1 is a film having substantially identical affinity for polymer components forming a self-assembly material.

Next, as shown in FIG. 13B, a material 70 having affinity for one of the plurality of polymer components forming the self-assembly material is coated. As a method for the coating, various methods may be employed, such as inkjet printing, screen printing, soft lithography (micro-contact printing), and lift-off processing. More specifically, the material 70 having the affinity is coated in such a manner as to form a shape such as a rhombus shape as in the first embodiment, for example. Alternatively, the material 70 is coated in such a manner that fine dots are distributed with gradation to form a gradation pattern as in the second embodiment, for example. Thus, chemical guides formed of the material 70 having the affinity are directly formed on the substrate to be processed 1.

Further, by coating the self-assembly material 4 on the substrate to be processed 1 in the same manner as in the first embodiment, a cyclic pattern having orientation defined by the chemical guides each formed of the material 70 is formed, and detailed description thereof is omitted herein since it is the same as that of the first embodiment.

As the material 70 with the affinity, SOG (Spin On Glass) (having affinity for PMMA), a hydrophobic material containing fluorine such as polytetrafluoroethylene (PTEF) (having affinity for PS), a material obtained by dissolving PMMA into an organic solvent such as propylene glycol monomethyl ether acetate (PGMEA) (having affinity for PMMA), a material obtained by dissolving PS into an organic solvent such as PGMEA (having affinity for PS), and the like are usable, for example.

As described above, according to the pattern formation method of the present embodiment, it is possible to autonomously and uniquely define the positions in the self-assembly material pattern to be formed in the self-aligned manner and to prevent misalignment of the positions. Further, according to the present embodiment, the chemical guides are easily obtained with the reduced number of process steps.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern formation method, comprising:
   forming chemical guides having affinity for a first polymer component on a substrate to be processed, a region of the chemical guides having a polygonal shape, the polygonal shape having a first diagonal line along a first direction and a second diagonal line shorter than the first diagonal line;
   supplying a directed self-assembly material comprising the first polymer component and a second polymer component on the substrate; and
   forming a first pattern on the first diagonal line and a second pattern next to the first pattern, the first pattern and the second pattern aligning along a second direction perpendicular to the first direction, the first pattern comprising the first polymer component and the second pattern comprising the second polymer component, the first pattern having a strip shape extending in the first direction, and the second pattern having a strip shape extending in the first direction.

2. The pattern formation method according to claim 1, wherein the chemical guides are formed by exposing a surface of the substrate to be processed having affinity for the first polymer component by etching on a neutral film formed on the substrate to be processed.

3. The pattern formation method according to claim 1, wherein the chemical guides are formed by performing a surface treatment on a surface of an organic material film formed on the substrate to be processed in such a manner that the organic material film surface acquires affinity for the first polymer component.

4. The pattern formation method according to claim 3, wherein the surface treatment is an oxidation treatment using oxidative plasma.

5. The pattern formation method according to claim 1, wherein each of the regions has a rhombus shape having a first diagonal line along the first direction and a second diagonal line which is shorter than the first diagonal line.

6. The pattern formation method according to claim 5, wherein a length of the first diagonal line is longer than twice of a length of the second diagonal line.

7. The pattern formation method according to claim 5, wherein the interval of the regions adjacent to each other along the first direction is shorter than or equal to the length of the first diagonal line of each of the regions.

8. The pattern formation method according to claim 5, wherein the chemical guides are formed by exposing a surface of the substrate to be processed having affinity for the first polymer component by etching on a neutral film formed on the substrate to be processed.

9. The pattern formation method according to claim 5, wherein the chemical guides are formed by performing a surface treatment on a surface of an organic material film formed on the substrate to be processed in such a manner that the organic material film surface acquires affinity for the first polymer component.

10. The pattern formation method according to claim 1, wherein each of the regions has an oval shape having a long axis which is along the first direction and a short axis which is along the second direction.

11. The pattern formation method according to claim 10, wherein the chemical guides are formed by exposing a surface of the substrate to be processed having affinity for the first polymer component by etching on a neutral film formed on the substrate to be processed.

12. The pattern formation method according to claim 10, wherein the chemical guides are formed by performing a surface treatment on a surface of an organic material film formed on the substrate to be processed in such a manner that the organic material film surface acquires affinity for the first polymer component.

13. A pattern formation method, comprising:
forming chemical guides having affinity for a first polymer component on a substrate to be processed, a region of the chemical guides having a gradation pattern along a centerline thereof extending in a first direction, a color of the gradation pattern gradually darkening from an end portion of the gradation pattern toward the centerline of the gradation pattern;
supplying a directed self-assembly material comprising the first polymer component and a second polymer component on the substrate; and
forming a first pattern on the centerline and a second pattern next to the first pattern, the first pattern and the second pattern aligning along a second direction perpendicular to the first direction, the first pattern comprising the first polymer component, the second pattern comprising the second polymer component, the first pattern having a strip shape extending in the first direction, and the second pattern having a strip shape extending in the first direction.

14. The pattern formation method according to claim 13, wherein the chemical guides are formed by exposing a surface of the substrate to be processed having affinity for the first polymer component by etching on a neutral film formed on the substrate to be processed.

15. The pattern formation method according to claim 13, wherein the chemical guides are formed by performing a surface treatment on a surface of an organic material film formed on the substrate to be processed in such a manner that the organic material film surface acquires affinity for the first polymer component.

16. The pattern formation method according to claim 1, wherein a width along the first direction of the region of the chemical guides is narrowed from the first diagonal line toward an end part of the region of the chemical guide.

17. The pattern formation method according to claim 1, wherein the polygonal shape is a tetragon.

18. The pattern formation method according to claim 1, wherein the polygonal shape has a plurality of diagonal lines, a first of the diagonal lines being longer than the remaining diagonal lines.

* * * * *